(12) United States Patent
Esteban

(10) Patent No.: US 11,691,483 B2
(45) Date of Patent: Jul. 4, 2023

(54) THERMAL SHIELD SYSTEM

(71) Applicant: Ramon C Esteban, Weyers Cave, VA (US)

(72) Inventor: Ramon C Esteban, Weyers Cave, VA (US)

( * ) Notice: Subject to any disclaimer, the term of this patent is extended or adjusted under 35 U.S.C. 154(b) by 1023 days.

(21) Appl. No.: 16/511,599

(22) Filed: Jul. 15, 2019

(65) Prior Publication Data
US 2020/0016961 A1 Jan. 16, 2020

Related U.S. Application Data

(60) Provisional application No. 62/698,704, filed on Jul. 16, 2018.

(51) Int. Cl.
*B60J 1/20* (2006.01)
*H05B 3/86* (2006.01)
(Continued)

(52) U.S. Cl.
CPC ............. *B60J 1/2091* (2013.01); *B32B 27/06* (2013.01); *B60S 3/008* (2013.01); *H05B 3/36* (2013.01);
(Continued)

(58) Field of Classification Search
CPC ........ B60J 1/2091; B32B 27/06; B32B 27/36; B32B 27/08; B32B 2605/00; B32B 2605/08; B32B 2605/12; B32B 2605/18; B32B 3/06; B32B 3/08; B32B 2250/03; B32B 2250/24; B32B 25/08; B32B 25/14;
(Continued)

(56) References Cited

U.S. PATENT DOCUMENTS 3,202,801 A * 8/1965 Saluri ................... H05B 3/342
219/528
3,594,547 A 7/1971 Quinn
(Continued)

FOREIGN PATENT DOCUMENTS

| CN | 107531007 A | * | 1/2018 | ............. B32B 15/00 |
| CN | 109076695 B | * | 11/2022 | ........... H05K 1/0278 |
| GB | 2584068 A | * | 11/2020 | ........... A47D 15/003 |

*Primary Examiner* — Shawntina T Fuqua
(74) *Attorney, Agent, or Firm* — Kimberly O Snead

(57) ABSTRACT

A thermal shield system with wireless control capabilities including a multi-layer shield, a housing containing a power source and processor, and a programmable control mechanism, wherein the control mechanism is in communication with the processor to facilitate direct or remote manual programming of time and temperature of the shield system. The multi-layer shield includes a perimeter having a first layer comprised of reflective material, a second layer comprised of a plurality of conductive pads arranged in a plurality of rows within a structural support sheet, a third layer comprised of thermal material, an electrical wire running through and connecting said conductive pads of the second layer, and a surround spanning the perimeter of the shield. The surround of the shield has flexibility to allow folding or rolling for compact storage of said shield and having rigidity to provide structural integrity of said shield. The electrical wire connects each of the plurality of conductive pads in a series to generate consistent and uniform heat while minimizing depletion of the power source.

19 Claims, 6 Drawing Sheets

(51) Int. Cl.
*B60S 3/00* (2006.01)
*B32B 27/06* (2006.01)
*H05B 3/36* (2006.01)
*H02S 99/00* (2014.01)
*H02S 40/38* (2014.01)

(52) U.S. Cl.
CPC ............ *H05B 3/86* (2013.01); *B32B 2605/00* (2013.01); *H02S 40/38* (2014.12); *H02S 99/00* (2013.01); *H05B 2203/01* (2013.01); *H05B 2203/031* (2013.01)

(58) Field of Classification Search
CPC ........ B32B 2307/302; B32B 2307/416; B32B 2307/546; B32B 2307/7265; B32B 2307/732; B32B 2571/00; B60S 3/008; B60S 3/08; H05B 3/36; H05B 3/86; H05B 2203/01; H05B 2203/031; H02S 40/38; H02S 99/00; H02S 20/30; Y02E 10/50; H01L 31/048
See application file for complete search history.

(56) References Cited

U.S. PATENT DOCUMENTS

| | | | |
|---|---|---|---|
| 4,202,396 A | 5/1980 | Levy | |
| 4,815,784 A | 3/1989 | Zheng | |
| 7,718,923 B1* | 5/2010 | Hansen | B60J 1/2094 219/202 |
| 7,723,651 B2* | 5/2010 | Yang | H05B 3/34 219/217 |
| 10,709,250 B2* | 7/2020 | Smith | A47C 4/286 |
| 11,534,334 B1* | 12/2022 | Augustine | A61F 7/007 |
| 2004/0201244 A1 | 10/2004 | Neuer et al. | |
| 2006/0219690 A1* | 10/2006 | Grinstead | A47C 21/048 219/217 |
| 2008/0197122 A1 | 8/2008 | Gober | |
| 2009/0107984 A1* | 4/2009 | Kohn | A61F 7/007 219/528 |
| 2011/0006050 A1 | 1/2011 | Nee et al. | |
| 2018/0317573 A1* | 11/2018 | Devito | H05B 3/342 |
| 2020/0075788 A1* | 3/2020 | Oh | H01L 31/0201 |
| 2022/0042639 A1* | 2/2022 | Grande | H05B 3/18 |

* cited by examiner

THERMAL SHIELD SYSTEM

FIELD OF THE INVENTION

This invention relates to a flexible, multi-layered thermal shield system for heating an adjacent surface evenly and consistently over time while self-regulating voltage to be less draining on the programmable power source. More specifically, the invention relates to a thermal warming and cooling, battery operated shield for use with vehicle windshields.

BACKGROUND OF THE INVENTION

Weather affects almost everyone's life on a daily basis. Normal seasonal variances in temperatures and precipitation can be annoying and inconvenient at best while extreme weather conditions, including high heat, frigid cold, and large amounts of precipitation, can be dangerous and life-threatening at worst. Being able to combat weather effects and protect or provide relief for property, structures, and even life is important for daily convenience, routine, comfort, and sometimes survival.

SUMMARY OF THE INVENTION

The present invention provides for a thermal shield system including a multi-layer shield, a housing containing a power source and processor, and a programmable control mechanism, wherein the control mechanism is in communication with the processor to facilitate programming of time and temperature of the shield system. The multi-layer shield includes a perimeter having a first layer comprised of reflective material, a second layer comprised of a structural sheet supporting a plurality of conductive pads arranged in a plurality of rows, a third layer comprised of thermal material, an electrical wire running through and connecting the conductive pads of said second layer, and a surround spanning the perimeter of the shield. The surround and structural sheet of the shield has flexibility to allow folding or rolling of the shield for compact storage while having rigidity to provide structural integrity of the shield. The electrical wire connects each of the plurality of conductive pads in a series to generate consistent and uniform heat while minimizing depletion of the power source.

BRIEF DESCRIPTION OF THE DRAWINGS

The advantages of the instant disclosure will become more apparent when read with the specification and the drawings, wherein.

DETAILED DESCRIPTION OF THE INVENTION

Definitions

Figure 1A:
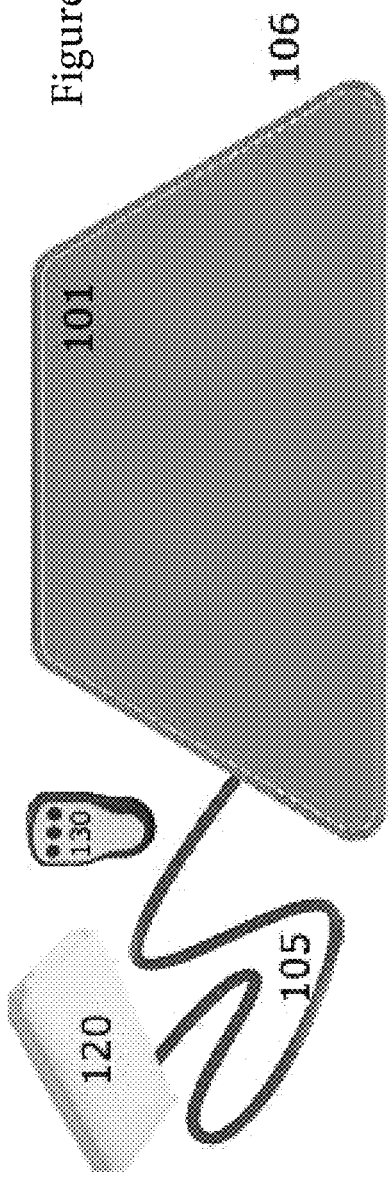
FIG. 1a shows a perspective view of the shield of the present invention with a remote control mechanism.

For the purposes employed herein, the term "shield" refers to a multi-layer, semi-flexible structure that provides protection or relief from undesirable elements.

For the purposes employed herein, the term "element-exposed surface" refers to any surface of an object, structure, or live being that is vulnerable to surface exposure to elements such as heat, cold, wind, and precipitation.

For the purposes employed herein, the term "thermal" refers to relating to heat.

For the purposes employed herein, the term "conductive" refers to having the property of conducting heat.

For the purposes employed herein, the term "PTC" or "Positive Temperature Co-efficient" refers to the increase of electrical resistance in a non-linear fashion as the temperature of a material or substance increases. PTC allows a heated material to level off at a manufactured temperature, creating uniform heating surfaces and eliminating hot spots, thermal runaway, and the like.

For the purposes employed herein, the term "vehicle" refers to any thing used for transportation including automobiles, trains, airplanes, helicopters, watercraft, and the like.

For the purposes employed herein, the term "positive temperature coefficient (PTC)" refers to materials that experience an increase in electrical resistance when their temperature is raised. Materials which have useful engineering applications usually show a relatively rapid increase with temperature, i.e. a higher coefficient. The higher the coefficient, the greater an increase in electrical resistance for a given temperature increase. A PTC material can be designed to reach a maximum temperature for a given input voltage, since at some point any further increase in temperature would be met with greater electrical resistance. Unlike linear resistance heating or NTC materials, PTC materials are inherently self-limiting. (Wikipedia)

For the purposes employed herein, the term "structural integrity" refers to the ability of the shield to support itself.

PARTS LIST 100 shield system
101 shield
102 first layer—reflective
103 second layer—conductive
104 third layer—thermal
105 power connecting electrical wire
106 surround
107 element exposed surface
108 attachment mechanism
110 conductive pads
111 rows
112 optional control cord
113 structural sheet
114 open spaces
120 housing
121 power source
122 processor
123 charging port
124 auxiliary port
125 solar panel
126 power cord plug
130 control mechanism The present invention is directed to a thermal shield system for use on an adjacent element-exposed surface, where the shield system can both provide a cooling effect in hot temperatures and provide heating in cold temperatures. The cooling effect is provided by a reflective layer on one side of the shield so as to reflect the sun's rays and prevent heat build-up and damage. The heating is provided by the conductive and thermal layers that heat evenly and consistently over time while self-regulating voltage to be less draining on the programmable power source. When heated, the shield system raises the temperature of the element-exposed surface thus providing uniform heat and decreasing buildup of precipitation such as frost, snow, and ice. The shield can be used with any surface that needs protection from heat, cold, and precipitation. This surface could include surfaces of buildings, vehicles, animals, persons, or other things needing protection from heat and cold. The shield system is particularly useful for use on windows of structures including windshields of vehicles including but not limited to automobiles, trucks, airplanes, and boats. For the purposes of the description herein, the shield system will be described for use in a vehicle windshield, but this embodiment is not meant to limit the use of the invention. The shield of the present invention can be manufactured in a variety of sizes, designed to safely connect to the structure surface, flexible for easy use and storage, configured to maintain, through a low voltage power source, a consistent heat temperature, and can be programmed and controlled through an attached or remote control mechanism.

For example, when used on a windshield, the shield can be produced in a range of sizes. For a small windshield up to 62×26 inches, the shield dimensions would be about 62×28 inches; for a medium windshield up to 66×29 inches, the shield dimensions would be about 66×32 inches; for a medium plus windshield up to 68×31 inches, the shield dimensions would be about 68×33 inches; for a large windshield up to 68×33 inches, the shield dimensions would be about 68×35 inches; and for an extra large windshield up to 69×35.5 inches, the shield dimensions would be about 69×38.5 inches. These dimensions are for standard size windshields. The shield of the present device can be customized with larger or smaller dimensions as needed for special surfaces. Alternately, for large surfaces, multiple shields can be used. The size of the shield should be sufficient to melt precipitation from at least 80% of the surface, and most preferably 90-100%. Regardless of the dimensions of the shield, the specification of the power source remains the same.

For ease of disclosure, the following shall refer to a shield system 100 for use on a car window and powered by a 12V battery. This is not intended to limit the scope of the invention. As noted above, the shield system 100 of the present invention can be used on any element-exposed surface. Further, while the shield system 100 is preferably powered by a rechargeable battery, the system could be heated by a variety of power sources including AC/DC, 12 volt accessory outlets, solar power, and direct connection to vehicles.

Figure 1B:
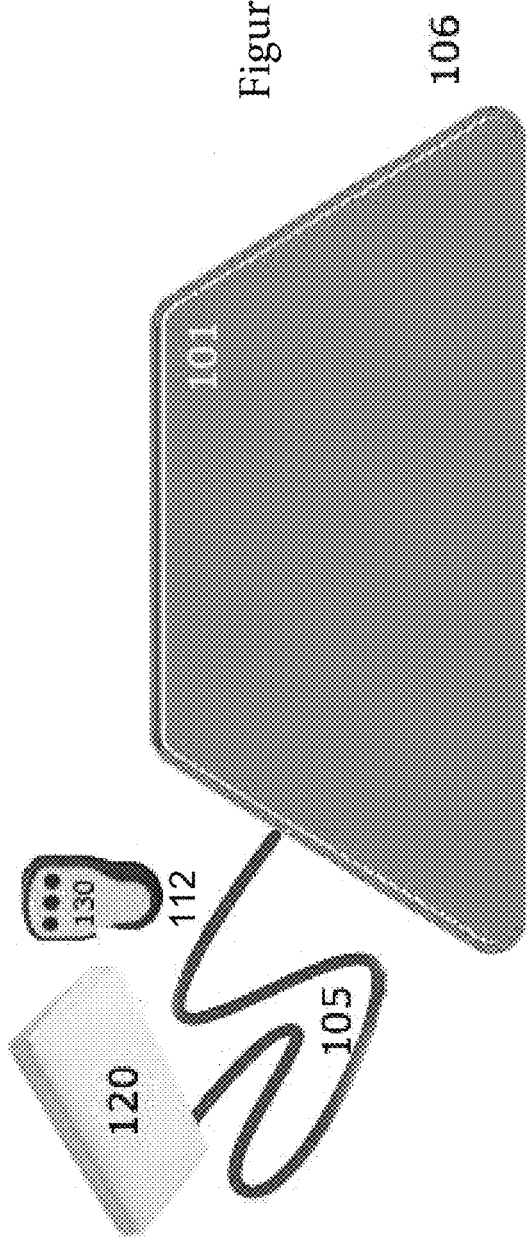
FIG. 1b shows a perspective view of the shield of the present invention with an attached control mechanism.
Figure 2A:
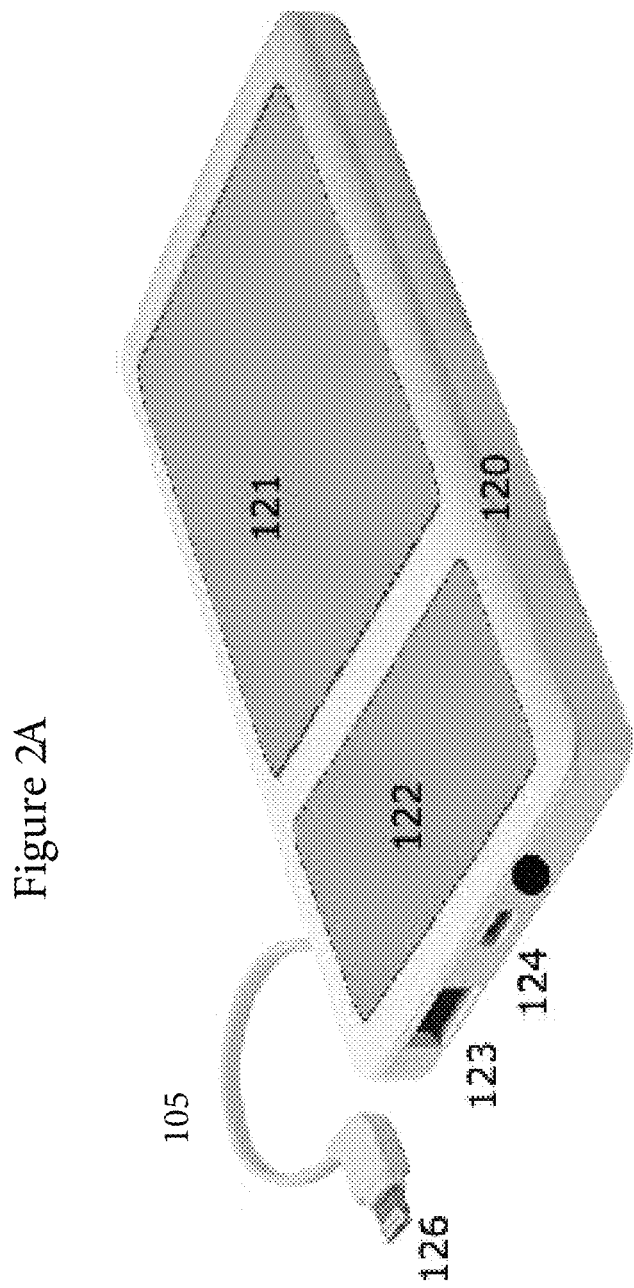
FIG. 2A is an interior view of the housing showing the power source and processor of the present invention.
Figure 2:
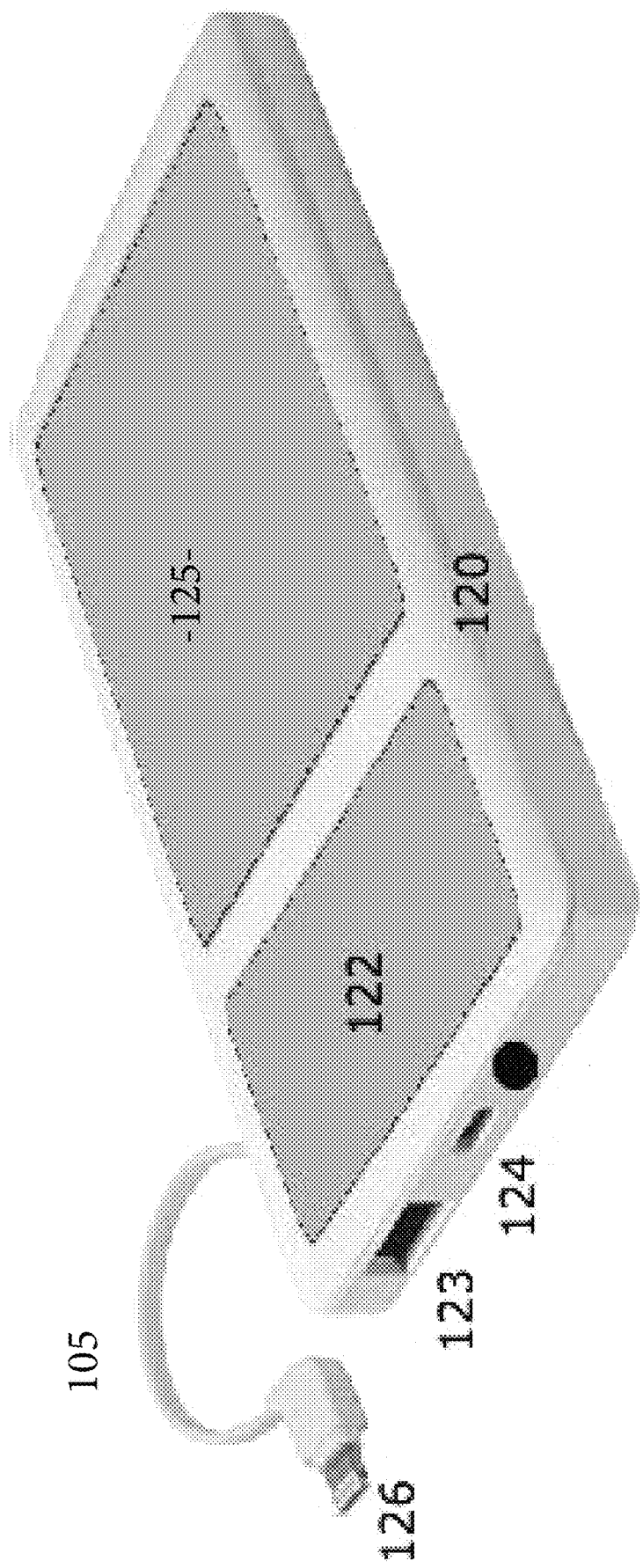
FIG. 2B is an exterior view of the housing showing a solar panel power source option of the present invention.
Figure 3:
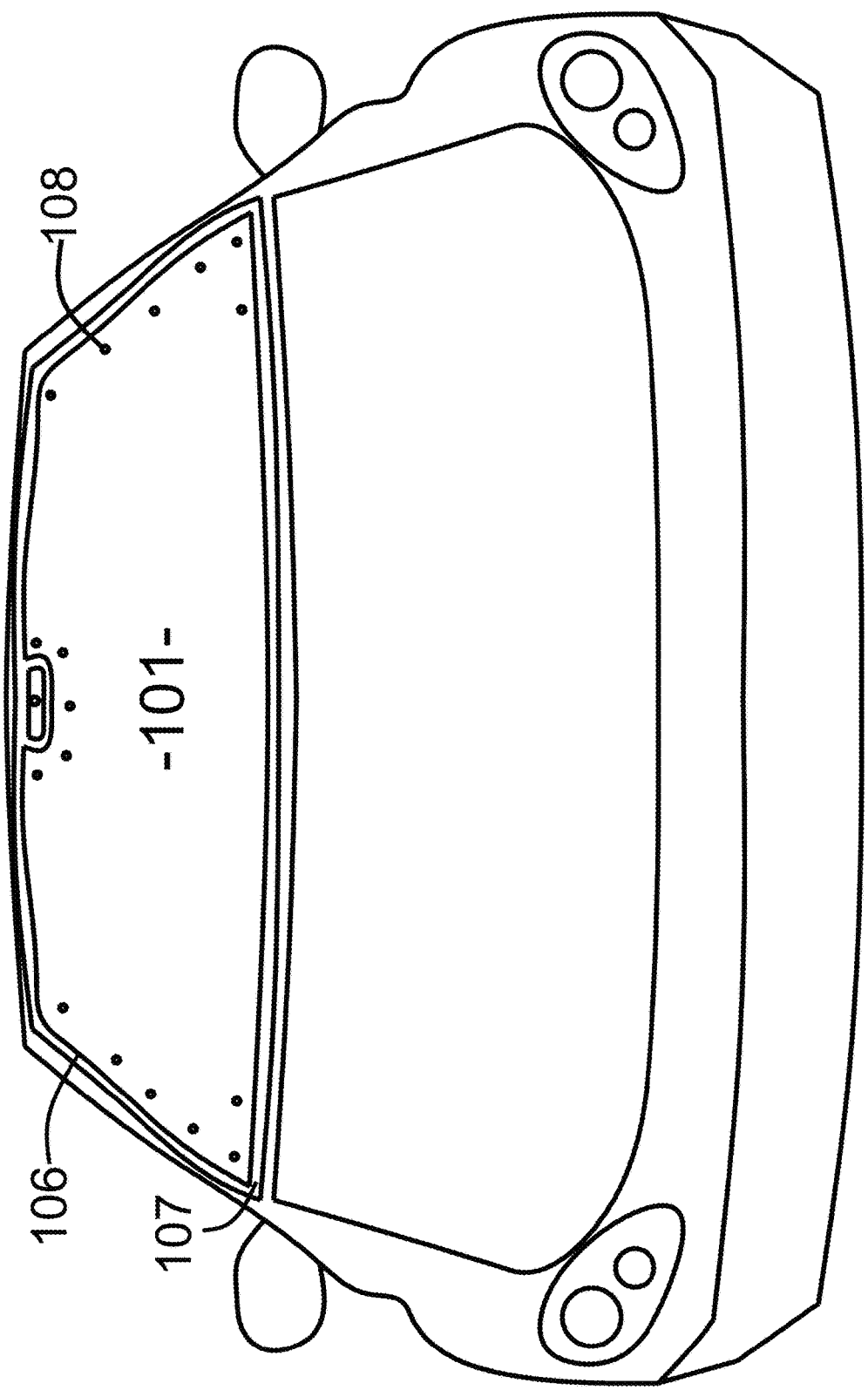
FIG. 3 is a perspective view of the shield of the present invention installed in a vehicle windshield.

As shown in FIGS. 1a and 1b, the shield system 100 is comprised of a shield 101; a housing 120 having a power source 121 (shown in FIG. 2A) and a processor 122 (shown in FIG. 2A); and a control mechanism 130. In FIG. 1a the control mechanism 130 is a detached remote-control mechanism, while in FIG. 1b the control mechanism 130 is attached to the housing 120 with cord 112. Regardless of the location, the control mechanism 130 enables the shield system 100 to be powered on and off and programmed for temperature and time. Shield 101 is comprised of multiple layers of reflective, conductive, and thermal materials configured in a substantially rectangular shape with a flexible surround 106. Surround 106 preferably has enough flexibility to allow the shield 101 to be rolled or folded for compact storage; however, surround 106 preferably also has enough rigidity to provide structural support for the shield 101. The surround 106 can be made of pliable fabric, metal, plastic, composites or other suitable material depending on the desired degree of support and flexibility. Shield 101 is held adjacent to the element-exposed surface 107 by an attachment mechanism 108 as shown in FIG. 3. Attachment mechanism 108 can be any attaching means known in the art such as suction cups, clips, hook and loop, and hook and eye attachment. With any of the attachment mechanisms, it is preferred that the shield 101 be adjacent to the element-exposed surface positioned at a distance ranging from flush against the surface to within about 1 inch of the element-exposed surface.

Figure 4:
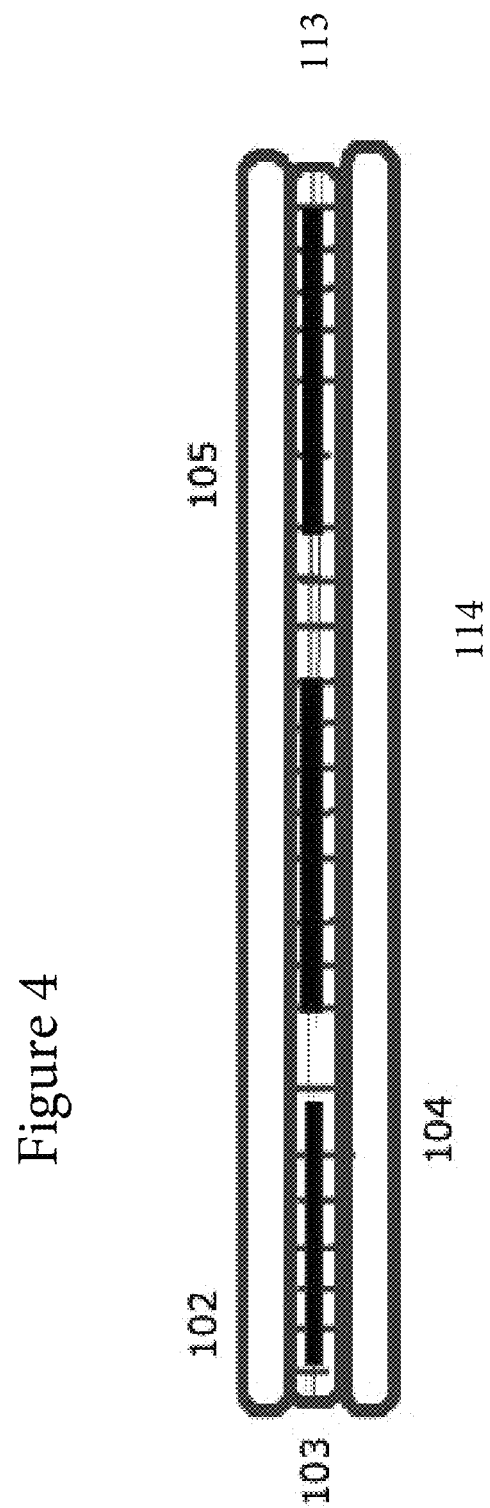
FIG. 4 shows a cross-sectional side view to illustrate the layers of the shield of the present invention.
Figure 5:
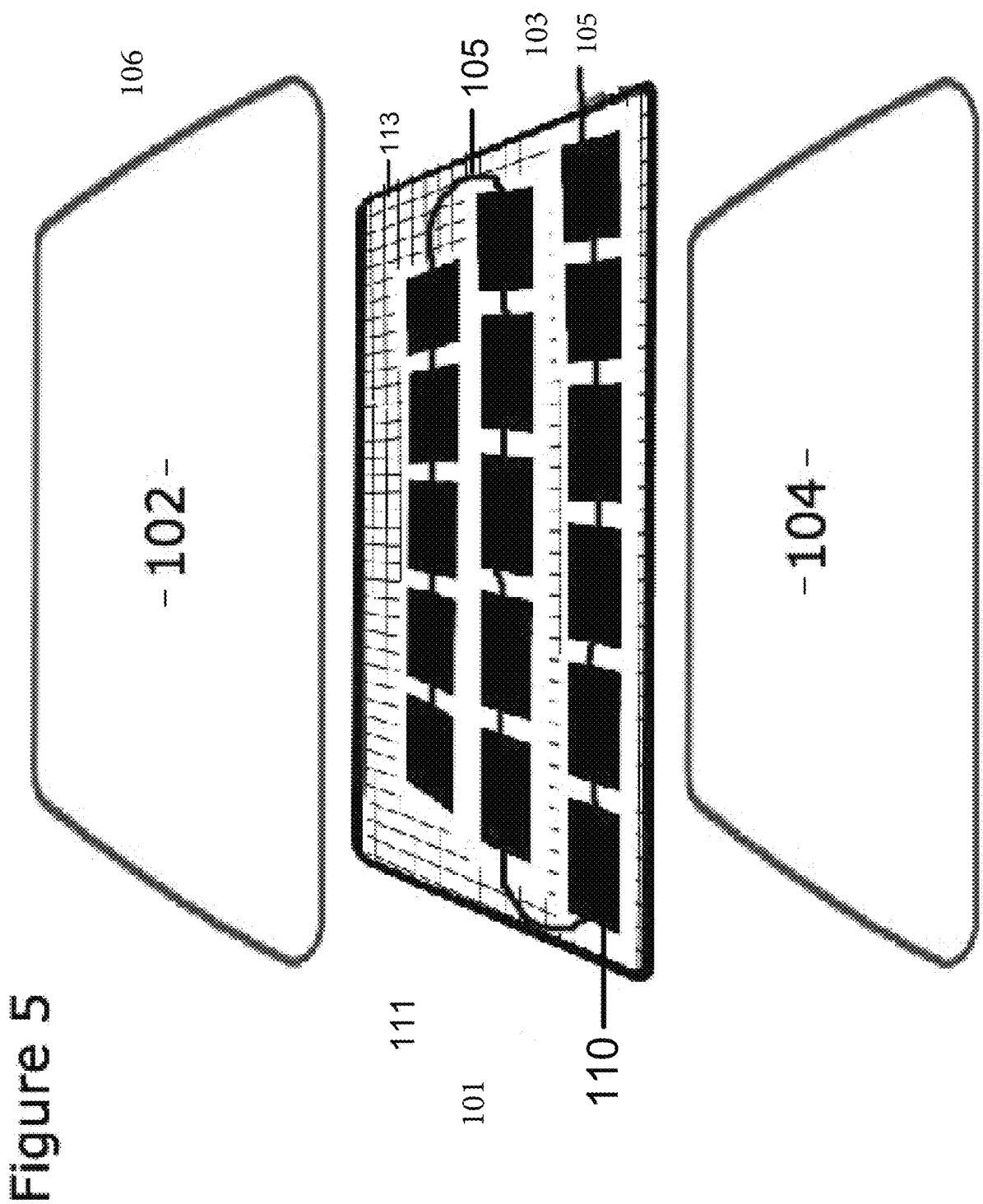
FIG. 5 shows an exploded view of the multiple layers of the present invention.

As illustrated in FIGS. 4 and 5, an electrical wire 105, and corresponding power source plug 126, runs through the conductive layer, described in detail hereinafter, and connects to the power source 121 within the housing 120. Power source 121, shown in FIG. 2A, comprises a low voltage, small, lightweight, rechargeable battery. While the power source 121 is preferably a 12 VDC battery, other batteries known in the art could be used such as but not limited to 18 VDC, 20 VDC, and 24 VDC. The type of battery used would depend on the intended use of the shield system. Housing 120 provides at least one charging port 123 port for charging the battery via electrical outlet, USB, or car battery. Further, as shown in FIG. 2B, housing 120 can include a solar panel 125 for charging the battery. In some embodiments the shield system 100 can use solar power that, when unavailable, defaults to the provided battery power. The housing 120 can also contain an auxiliary port 124. Housing 120 is small enough to be easily stored and is preferably about 7 in.×4 in.×1 in. or smaller in size. It is preferred that shield 101 contain a storage pocket for storing the battery when not in use. In order for the shield system to be able to safely and effectively heat a large element-exposed surface 107 with a small 12V DC battery, the shield 101 includes a very efficient and specifically configured conductive layer.

As shown in FIG. 2A, housing 120 holds power source 121 and processor 122. Processor 122 communicates with controlling mechanism 130. Controlling mechanism 130 allows a user of the shield system 100 to power the shield 101 on and off as well as program the shield 101 for the desired functionality. The shield 101 can be programmed via the control mechanism 130 to choose a temperature and time cycle appropriate for the exposed elemental surface 107. The controlling mechanism 130 can be attached directly to the shield system via a cord 112 as shown in FIG. 1b. However, the preferred shield system is equipped with wireless capability (such as but not limited to Bluetooth) to allow for remote control of the system as shown in FIG. 1a. For wireless enabled systems, the controlling mechanism 130 can be a specialized remote for the shield system 100, a smartphone, or any other wireless enabled mobile or computer device.

As shown in FIG. 4, the multiple layers of the shield 101 are preferably comprised of a first reflective layer 102, a second conductive layer 103, and a third thermal layer 104. The layers combine to provide a shield 101 that is about 0.5-1.0 cm in thickness. While other thicknesses can be applicable for specialized uses, this configuration allows for the lightweight flexibility optimal for most consumer uses.

All layers are constructed to provide, when combined, flexibility, heating and cooling properties, quick use, sustained comfort, and easy management. The multiple layers of the shield system can include solar materials for powering the system. The material of the first reflective layer can be any reflective material known to those skilled in the art having a thickness of about 0.02 mm. The preferred material for first reflective layer 102 is a polyester film such as Mylar® or its equivalent. The first reflective layer 102 can be decorative including different colors, images, or wording. The thermal material of the third layer can be any thermal material known to those skilled in the art having a thickness of about 0.02 mm. The preferred material for third layer 104 is a polyester, waterproof, heat spreading film such as Mylar®, neoprene, or an equivalent. Second conductive layer 103 is comprised of a structural sheet 113 supporting a plurality of conductive pads 110. The structural sheet 113 is preferably comprised of a flexible plastic having a thickness of about 0.2 mm to about 3 mm. The thickness of the structural sheet 113 is approximately the same as the thickness of the conductive pads 110. Structural sheet 113 is comprised of a plurality of open spaces 114 for receiving pads 110 and wire 105. The area between the open spaces 114 of the structural sheet 113 can be a solid sheet or have grid-like configuration. Each of said plurality of pads 110 is set in one of said plurality of open spaces 114 that maintains spatial placement, provides structure, and protects the wires 105 running through the conductive second layer 103.

The conductive material of the pads 110 of the second layer 103 can be any heat conductive material known in the art having the following features: conductive particles evenly distributed through the material, lightweight having a weight in the range of about 0.01-0.025 ounces per square inch, a thickness in the range of about 0.2 mm to about 3 mm, the ability to heat to at least 150-525 degrees Fahrenheit (150-197 degrees Celsius) via a low voltage power source, the ability to convert at least 98% of the power supplied to the material directly to heat, the ability to uniformly distribute and dissipate heat with no hot spots, and the ability to draw less current as the temperature of the material increases thus exhibiting a Positive Temperature Coefficient (PTC) allowing for self-regulation of electrical current. It is preferred that the conductive material of second layer 103 also have a high elasticity rating, flexibility at temperatures below freezing, resistance to age, weather, UV, ozone, chemicals, and water, and the ability to emit Far Infrared Ray (FIR) Range, The preferred material for second conductive layer 103 of shield 101 is patented FabRoc™ material manufactured by EXO2, or its equivalent.

The characteristics of the conductive layer 103 are critical to the efficient heating and battery use of the shield system 100. By regulating the voltage, the conductive pads 110 of second conductive layer 103 are heated to the desired temperature (up to 572° F.). Uniform distribution and dissipation of heat allows the shield 101 to be located in close proximity to the element exposed surface 107 in order to maximize heat production and minimize energy loss. Conductive pads 110 preferably contain specially blended conductive particles and exhibit a Positive Temperature Coefficient (PTC) which allows the pads to level off at a desired temperature, creating uniform heating surfaces and eliminating hot spots, thermal runaway and the like. When voltage is applied to the conductive pads, current flows through the conductive layer causing a rise in heat. As the temperature of conductive pads 110 increases, electrical resistance also increases in a non-linear fashion. Once each pad reaches the desired temperature, it self-regulates by drawing less electrical current until power is again required.

As shown in FIG. 5 and as mentioned briefly above, second conductive layer 103 is configured so that a low voltage battery can be used to safely and effectively power the shield 101 to a high enough heat to remove precipitation build-up on the element-exposed surface 107 as well as prevent additional accumulation. The shield 101 should reach a temperature in the range of about 150-225 degrees Fahrenheit (150-197 degrees Celsius), with a most preferred temperature of about 180 degrees Fahrenheit (82 degrees Celsius).

Prior to the disclosed, heating a piece of conductive material approximately the size of a windshield with an independent battery source (not attached to the car battery) to this heat would not be possible due to the span of the windshield and the battery power necessary to heat the material to a sufficient temperature for the time required to melt snow and ice from the exterior windshield. For an independent battery to accomplish this task, the battery would have to be the size of a car battery to provide the necessary heat and time needed to work efficiently. As discussed in more detail below, the present invention provides a shield system with a shield configuration that allows for use of a small, low voltage, rechargeable independent battery source that is remote capable, wireless, and smart device controlled. While the shield system 100 can alternatively be charged with a car battery, it is not required. As shown in FIGS. 2A and 2B housing 120 of shield system 100 includes means for recharging the battery of power source 121. The charging means includes at least one charging port 123 for recharging the battery via an electrical outlet, car battery, or computing device. Also, the charging means can include a solar panel 125 mounted on housing 120.

The shield 101 of the present invention heats quickly and maintains consistent heat temperature for an extended period of time without the need to use direct energy from a car. The conductive pads 110 are heated to a desired temperature within about 2 seconds to about 3 minutes, with the heating time required depending on the temperature to be achieved. Once heated, while the shield 101 is activated the shield 101 maintains a continual heat temperature for up to about 3 hours before the battery is depleted. If the power to the shield 101 is cycled on and off, the shield system can be used for a longer period of time. The exact time will depend mainly on the temperature goal and how long the heat is maintained each cycle. When not in active use, the shield 101 remains charged for up to about 72 hours. The extended heat time without the use of a car battery is accomplished through the configuration of the conductive second layer 103.

As shown in FIG. 5, second layer 103 is comprised of a structural sheet 113 supporting a series of conductive pads 110 arranged in multiple rows 111. Pads 110 are generally of uniform size and shape but can be varied, based on end use. Pads 110 can range in length from about 4-14 inches and in width from about 3-7 inches, with the most preferred size for a typical windshield being about 4×5 to 5×6 inches. A 4×5 inch conductive pad has a weight around 0.36 oz. Any conductive pad has a weight around 0.01-0.025 oz/in$^2$. The preferred size of the pads for a particular use produces the most consistent heat and draws the least amount of power necessary to heat the span of the particular element-exposed surface. The preferred thickness of the conductive pads is in the range of about 0.6-1.0 mm.

The series of pads 110 are connected by a wire 105 running through each conductive pad 110 and snaking its way through the second layer 103 to connect all pads 110 in all rows. The wires running through each row are typically about 3-4 inches from the wire in adjacent rows. The pads 110 and the wire 105 are supported and housed by the structural sheet 113 to keep the heat pads in place, protect the wire, and prevent any footprint of the pads and wire from showing on the exterior of the shield 101. First layer 102, second layer 103, and third layer 104 are fused together and attached to surround 106 to hold all elements of the shield in place.

In this configuration the electrical wiring is connected in series, thus as known in the electrical arts, drawing less battery power than parallel circuits. Additionally, the multiple pads 110 will draw less power than a single large pad, allowing the battery power to last much longer with more consistent universal heating capabilities. In the electrical series, electrical energy is transferred from the power source to the first pad, from the first pad to the second pad, from the second pad to the third pad, and so on with the current ending at a last pad thus creating an open circuit. Each pad is heated uniformly in less than 3 minutes with each pad drawing preferably about 2.5 amps of electrical current. The amps drawn can be controlled based on battery voltage (e.g. 8v, 10v, 12v, 18v, 20v, etc.) The battery life varies based on the battery voltage. Battery size determines the length of time heat can be produced but can be adjusted based on the voltage of the battery.

As an example, an effective configuration of the second layer 103 uses 10-20 conductive pads 110, with about 15-17 conductive pads providing optimal heat capacity for eliminating precipitation buildup with minimal battery drain for a typical car windshield. Arrangement of the conductive pads 110 can also increase efficiency. For example, arranging conductive pads 110 so that more pads 110 are located at the bottom of the shield 110 and less at top optimizes heat capacity and minimizes drain on the battery. As illustrated in FIG. 5 a configuration of three rows of offset heat pads 110 with nine heat pads 110 on the bottom row, five heat pads 110 in the middle row, and three heat pads 110 on the top row provides the most desired heat and battery performance for a typical windshield. The number of pads used in a row will be determined by the specific use of the shield and the size of the element-exposed surface. The number of heat pads 110 will vary based on the size of the determined shield. Since heat rises, aligning more equally spaced heat pads 110 at the base of shield 101 and aligning fewer heat pads 110 toward the top the shield 101 provide optimal efficiency to remove snow and ice from the windshield glass. By using electrical wiring in a series, made possible by multiple rows of conductive pads 110, the shield system 100 of the present invention can use a small, rechargeable, wireless-enabled battery source for about 30 minutes to 3 hours with a consistent temperature between 160 and 180 degrees Fahrenheit (71-82 degrees Celsius). If the shield system 100 is cycled on and off, the battery life increases. Once depleted, the battery can be recharged via a car power outlet to full power in 2-3 hours or fully charged via a wall outlet in less than two hours.

The shield system 100 makes dealing with inclement weather easy, convenient, and environmentally friendly. The entire shield system 100 can easily be folded or rolled up and stored in a vehicle or other convenient space. When required, the shield 101 can easily be mounted on the interior of an element-exposed surface 107 of an object or structure with the attachment mechanism 108. If being used on a live being the shield 101 can simply be wrapped around the body or incorporated into clothing. Once the shield 101 is in place, the reflective surface can reflect the sun's rays and provide cooling effect in hot weather or the power source can be turned on to provide heat to the element-exposed surface during cold weather. With the remote-control mechanism option, the shield system 100 can be powered on and programmed from the comfort of a home or office when the need arises. Regardless of the location of the control mechanism, the control mechanism is used to set the desired functionality of the shield system via communication with the processor 122 in housing 120. The shield system 100 can be programmed in several ways. The user can choose a specific temperature and time duration, after which the system will power off. Alternatively, the user can choose a temperature and a time cycle during which the system will power on and off repeatedly. Another option is preset programs for different weather conditions for which the user only must choose the desired option, for instance, ice, snow, or frost. These preset programs are set to achieve specific desired temperatures for a specific time period. The preset programs can cycle on and off repeatedly for severe, prolonged storms or simply turn off for less severe weather. The system 100 can also be programmed to turn on at a specific time every day for conditions such as cold winter mornings to eliminate frost. The options for programmable use are immense and only limited by the imagination of the programmer.

Broad Scope of the Invention

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims (e.g., including that to be later added) are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language of the present invention or inventions should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example."

What is claimed is:

1. A thermal shield system comprising:
a multi-layer shield having a perimeter and comprising:
   a) a first layer comprised of reflective material,
   b) a second layer comprised of a structural sheet supporting a plurality of conductive pads arranged adjacently in a plurality of rows, said structural sheet providing structural integrity to said multi-layer shield and being comprised of a flexible plastic material having a plurality of open spaces, each of said open spaces receiving one of said plurality of conductive pads,
   c) a third layer comprised of thermal material,
   d) an electrical wire supported within said structural sheet of said second layer, said electrical wire running through and connecting each of said plurality of conductive pads with at least one adjacent conductive, and
   e) a surround spanning the perimeter of said multi-layer shield, said surround having flexibility to enable compact storage of said multi-layer shield and having rigidity to enable structural integrity to said multi-layer shield;
a housing containing a power source and processor, said power source adjoining said electrical wire; and
a programmable control mechanism, said control mechanism in communication with said processor;
wherein said second layer is secured between said first layer and said third layer;
wherein said electrical wire connects each of said plurality of conductive pads in a series, each of said plurality of conductive pads drawing electrical current to generate, consistently maintain, and uniformly distribute heat; and
wherein each of said plurality of conductive pads self-regulate said electrical current based on a pre-determined temperature set with said control mechanism.

2. The thermal shield system of claim 1, wherein each of said plurality of conductive pads draws about 2.5 amps of electrical current.

3. The thermal shield system of claim 1, wherein voltage of said power source controls amps of electrical current drawn by each of said plurality of conductive pads.

4. The thermal shield of claim 1, wherein said power source is a rechargeable low voltage battery.

5. The thermal shield of claim 4, wherein said low voltage battery is rechargeable via a power cord that engages an external charging source.

6. The thermal shield system of claim 4, wherein said low voltage battery is rechargeable via a solar panel.

7. The thermal shield system of claim 1, wherein said conductive pads of said second layer are comprised of a material having the following characteristics:
   a) a weight in the range of about 0.01 oz/in$^2$ to about 0.025 oz/in$^2$,
   b) a thickness in the range of about 0.5 mm to about 1.5 mm,
   c) containing conductive particles,
   d) ability to reach a temperature of at least 150-525 degrees Fahrenheit via a low voltage power source,
   e) ability to convert at least 98% of power supplied to said material directly to heat,
   f) ability to uniformly distribute and dissipate heat with no hot spots,
   g) ability to draw less current as temperature of said material increases,
   h) a Positive Temperature Coefficient (PTC) allowing for self-regulation of electrical current.

8. The thermal shield system of claim 1 further comprising an attachment mechanism for attaching said multi-layer shield to an element-exposed surface.

9. The thermal shield system of claim 8 wherein said element-exposed surface is a window of a structure.

10. The thermal shield system of claim 8 wherein said element-exposed surface is a windshield.

11. The thermal shield system of claim 8 wherein said element-exposed surface is skin of a living being.

12. The thermal shield system of claim 8, wherein said attachment mechanism holds said multi-layer shield in a position adjacent said element-exposed surface, said position being in the range of flush against said surface to about 1.5 inches from said surface.

13. The thermal shield system of claim 8, wherein said multi-layer shield heats to a temperature in the range of about 150-525 degrees Fahrenheit and provides consistent and uniform heat distribution and dissipation to said element-exposed surface.

14. The thermal shield system of claim 1 wherein said processor and said control mechanism have wireless connection capabilities.

15. The thermal shield system of claim 14 wherein said control mechanism is a mobile computing device.

16. The thermal shield of claim 1 wherein said plurality of conductive pads is 10-20 pads arranged in an equidistant configuration in said plurality of rows.

17. The thermal shield of claim 1 wherein said plurality of conductive pads is arranged in a configuration of three adjacent rows having a top row, a middle row, and a bottom row, each of said rows containing a plurality of conductive pads, said plurality of conductive pads in each row being offset from said plurality of conductive pads in each adjacent row.

18. The thermal shield of claim 1 wherein said processor is programmable via said control mechanism for powering said shield system, for setting the temperature of said shield system, and for setting the time duration of said shield system.

19. A remotely programmable thermal shield system for treating an element-exposed surface comprising:
a multi-layer shield comprising:
   a) a first layer comprised of reflective material,
   b) a second layer comprised of a structural sheet supporting a plurality of conductive pads arranged in a plurality of rows, said structural sheet providing structural integrity to said multi-layer shield and being comprised of a flexible plastic material having a plurality of open spaces, each of said open spaces receiving one of said plurality of conductive pads, said plurality of conductive pads having the following characteristics:
      i) a weight in the range of about 0.01 oz/in$^2$ to about 0.025 oz/in$^2$,
      ii) a thickness in the range of about 0.5 mm to about 1.5 mm,
      iii) containing conductive particles,
      iv) the ability to heat to at least 150-225 degrees Fahrenheit via a low voltage power source,
      v) the ability to uniformly distribute and dissipate heat, and
      vi) a Positive Temperature Coefficient (PTC) allowing for self-regulation of electrical current, c) a third layer comprised of thermal material,
d) an electrical wire running through and connecting said conductive pads of said second layer, and
e) a surround spanning the perimeter of said multi-layer shield, said surround having flexibility to allow folding or rolling of said multi-layer shield and having rigidity to create structural integrity of said multi-layer shield;

a housing containing a rechargeable low-voltage power source and processor, said power source adjoining said electrical wire;

a programmable control mechanism, said control mechanism in communication with said processor; and an attachment mechanism holding said multi-layer shield in a position adjacent said element-exposed surface, said position ranging from flush against said surface to about 1.5 inches from said surface;

wherein said electrical wire connecting each of said plurality of conductive pads creates an electrical wiring series drawing electrical current to generate, consistently maintain, and uniformly distribute heat, wherein each of said plurality of conductive pads self-regulate said electrical current when a desired temperature is achieved by said conductive pads, wherein said plurality of conductive pads is 10-20 pads, and wherein said processor is programmable via said control mechanism for powering said shield system, for setting the desired temperature of said shield system, and for setting a functioning time duration of said shield system.

* * * * *